(12) United States Patent
Yamaura et al.

(10) Patent No.: US 9,428,672 B2
(45) Date of Patent: Aug. 30, 2016

(54) CROSSLINKING AID AND PRACTICAL APPLICATION THEREOF

(71) Applicant: NIPPON KASEI CHEMICAL COMPANY LIMITED, Iwaki-shi, Fukushima-ken (JP)

(72) Inventors: Mabuko Yamaura, Iwaki (JP); Yukio Orikasa, Iwaki (JP); Kazuya Senzaki, Iwaki (JP)

(73) Assignee: NIPPON KASEI CHEMICAL COMPANY LIMITED, Iwaki (JP)

( * ) Notice: Subject to any disclaimer, the term of this patent is extended or adjusted under 35 U.S.C. 154(b) by 0 days.

(21) Appl. No.: 14/767,678

(22) PCT Filed: Feb. 21, 2014

(86) PCT No.: PCT/JP2014/054126
§ 371 (c)(1),
(2) Date: Aug. 13, 2015

(87) PCT Pub. No.: WO2014/129573
PCT Pub. Date: Aug. 28, 2014

(65) Prior Publication Data
US 2015/0353784 A1    Dec. 10, 2015

(30) Foreign Application Priority Data

Feb. 21, 2013    (JP) .................................. 2013-032282

(51) Int. Cl.
| | |
|---|---|
| *C08J 3/24* | (2006.01) |
| *C09J 123/08* | (2006.01) |
| *C09J 131/04* | (2006.01) |
| *C08K 5/3492* | (2006.01) |
| *C09J 123/36* | (2006.01) |
| *C08K 5/20* | (2006.01) |
| *H01L 31/048* | (2014.01) |

(52) U.S. Cl.
CPC ................ *C09J 123/36* (2013.01); *C08K 5/20* (2013.01); *C08K 5/34924* (2013.01); *H01L 31/0481* (2013.01); *C08J 2331/04* (2013.01); *C09J 123/0853* (2013.01); *Y02E 10/50* (2013.01)

(58) Field of Classification Search
CPC ..... C09J 123/08; C09J 123/0853; C09J 123/36; C09J 131/04; C08K 5/20; C08K 5/205; C08K 5/34924; C08J 3/24; C08J 2331/04; C08J 2323/08; H01L 31/0481; Y02E 10/50
USPC ........................................................ 525/330.5
See application file for complete search history.

(56) References Cited

U.S. PATENT DOCUMENTS 4,874,826 A * 10/1989 Sakamoto ............... B32B 27/04
                                                                                535/390

FOREIGN PATENT DOCUMENTS

| JP | 60-226589 | 11/1985 |
|---|---|---|
| JP | 7-165964 | 6/1995 |
| JP | 9-31220 | 2/1997 |
| JP | 2000-63701 | 2/2000 |
| JP | 2007-123488 | 5/2007 |
| JP | 2009-135200 | 6/2009 |

OTHER PUBLICATIONS

International Preliminary Report on Patentability issued in PCT/JP2014/054126 dated Aug. 25, 2015.
International Search Report for PCT/JP2014/054126, mailed Apr. 1, 2014, 2 pages.

* cited by examiner

*Primary Examiner* — Roberto Rabago
(74) *Attorney, Agent, or Firm* — Nixon & Vanderhye P.C.

(57) ABSTRACT

The present invention provides a crosslinking aid comprising triallyl isocyanurate (TAIC), which serves for obtaining an adhesive resin exhibiting excellent insulation properties while maintaining good transparency, adhesive properties, heat resistance and flexibility of conventional crosslinked ethylene-vinyl acetate copolymers. The crosslinking aid of the present invention comprises a urethane poly(meth)acrylate in combination with triallyl isocyanurate.

7 Claims, No Drawings

CROSSLINKING AID AND PRACTICAL APPLICATION THEREOF

This application is the U.S. national phase of International Application No. PCT/JP2014/054126 filed 21 Feb. 2014 which designated the U.S. and claims priority to JP Patent Application No. 2013-032282 filed 21 Feb. 2013, the entire contents of each of which are hereby incorporated by reference.

TECHNICAL FIELD

The present invention relates to a crosslinking aid and application thereof. More specifically, the present invention relates to a widely used crosslinking aid comprising triallyl isocyanurate (TAIC) and application thereof (for example, a sealing material for a solar cell, etc.).

BACKGROUND ART

Conventionally, as a sealing material used for assembly of various kinds of electronic material modules, there has been proposed a resin composition comprising an ethylene-based copolymer as a base material and an organic peroxide as a crosslinking agent mixed with the ethylene-based copolymer (Patent Literature 1).

In addition, there has been proposed an adhesive sheet for a solar cell which is constituted of 100 parts by weight of an ethylene-based copolymer and 0.05 to 0.5 parts by weight of an organic peroxide, and comprises a multifunctional monomer having four or more acryloyl and/or methacryloyl groups in total (Patent Literature 2).

Further, there has been proposed a sealing film for a solar cell which comprises an ethylene-unsaturated ester copolymer, a crosslinking agent and a crosslinking aid, in which the crosslinking aid comprises a polyfunctional (meth)acrylate of a polyhydric alcohol and TAIC (Patent Literature 3).

Meanwhile, TAIC is known as a useful crosslinking aid upon obtaining a molded body by curing a cross-linkable polymer. In particular, when crosslinking an ethylene-based vinyl acetate copolymer with an organic peroxide, TAIC is essentially required as a crosslinking aid, and is capable of providing a sealing material for a solar cell which has high transparency, adhesive properties, heat resistance and flexibility. However, a polymer having a polar group such as an ethylene-vinyl acetate copolymer tends to be insufficient in insulation properties (volume resistivity value) even when cross-linked using TAIC. There is still room for improvement even when the polymer is used in combination with a polyfunctional (meth)acrylate of a polyhydric alcohol according to the above-proposed conventional art.

CITATION LIST

Patent Literatures

Patent Literature 1: Japanese Patent Application Laid-Open (KOKAI) No. 60-226589 (1985)
Patent Literature 2: Japanese Patent Application Laid-Open (KOKAI) No. 2007-123488
Patent Literature 3: Japanese Patent Application Laid-Open (KOKAI) No. 2009-135200

SUMMARY OF THE INVENTION

Problems to be Solved by the Invention

The present invention has been made in view of the above circumstances. The object of the present invention is to provide a crosslinking aid comprising TAIC, which serves for obtaining an adhesive resin composition exhibiting excellent insulation properties while maintaining good transparency, adhesive properties, heat resistance and flexibility of conventional crosslinked ethylene-vinyl acetate copolymers.

Means for Solving the Problems

As a result of the present inventors' earnest study to achieve the above object, it has been found that the above object of the present invention can be achieved by using a specific compound in combination with TAIC.

The present invention has been accomplished on the basis of the above findings, and includes the following aspects relating to a crosslinking aid and applications thereof.

(1) A crosslinking aid comprising a urethane poly(meth)acrylate in combination with triallyl isocyanurate.

(2) The crosslinking aid according to the above aspect (1) which is used for obtaining an ethylene copolymer.

(3) A heat-crosslinking resin composition comprising an ethylene copolymer, a crosslinking agent and the crosslinking aid as defined in the above aspect (1).

(4) A radiation-crosslinking resin composition comprising an ethylene copolymer and the crosslinking aid as defined in the above aspect (1).

(5) A sealing material comprising the heat-crosslinking resin composition as defined in the above aspect (3).

(6) A sealing material comprising the radiation-crosslinking resin composition as defined in the above aspect (4).

(7) The sealing material according to the above (5) or (6), which is used for a solar cell.

Effect of the Invention

According to the present invention, there is provided a crosslinking aid that is capable of providing an adhesive resin composition having excellent insulation properties while maintaining good transparency, adhesive properties, heat resistance and flexibility of conventional crosslinked ethylene-vinyl acetate copolymers.

EMBODIMENTS FOR CARRYING OUT THE INVENTION

<Crosslinking Aid>

The crosslinking aid according to the present invention comprises a urethane poly(meth)acrylate in combination with TAIC.

(Urethane poly(meth)acrylate)

The urethane poly(meth)acrylate can be synthesized, for example, from an organic isocyanate and a hydroxyl group-containing (meth)acrylate. The urethane poly(meth)acrylate having a high molecular weight is preferred. The number-average molecular weight of the urethane poly(meth)acrylate is not less than 1000, and preferably not less than 1200. The upper limit of the number-average molecular weight of the urethane poly(meth)acrylate is usually 10,000.

The organic isocyanate is a compound having two or more isocyanate groups in a molecule thereof. Examples of the organic group include a linear, branched or cyclic aliphatic hydrocarbon group, an aromatic hydrocarbon group, a heterocyclic ring group such as isocyanurate group. Specific examples of the organic isocyanate include 1,6-hexamethylene diisocyanate, isophorone diisocyanate, toluidine diisocyanate, MDI (diphenylmethane diisocyanate), hydrogenated MDI, xylylene diisocyanate, a trimer of 1,6-hexamethylene diisocyanate, a trimer of isophorone diisocyanate, and the like.

The hydroxyl group-containing (meth)acrylate is a (meth) acrylate having one or more hydroxyl groups in a molecule thereof. Examples of the hydroxyl group-containing (meth) acrylate include (meth)acrylates of polyhydric alcohols. Specific examples of the hydroxyl group-containing (meth) acrylate include trimethylolpropane di(meth)acrylate, pentaerythritol trimethacrylate, dipentaerythritol tetra(meth) acrylate, tripentaerythritol (meth)acrylate, polyalkyl diol (meth)acrylates, polyethylene glycol (meth)acrylate, polyalkylene glycol (meth)acrylates, glycerin di(meth)acrylate and polyol (meth)acrylates. These hydroxyl group-containing (meth)acrylates may be in the form of a single acrylate or a mixture of these acrylates.

Examples of commercially available products of the urethane poly(meth)acrylate include "UA-306H", "UA-306T", "UA-306I" and "UA-510H" all produced by Kyoeisha Chemical Co., Ltd., "KRM7864", "KRM8452", "EB1290", "EB1290K" and "EB5129" all produced by Daicel Cytec Co., Ltd., "U-6HA", "U-6LPA", "U-15HA", "UA-33H" and "UA-122P" all produced by Shin-Nakamura Chemical Co., Ltd., "UV7600B", "UV7605B", "UV7610B" and "UV7620EA" all produced by Nippon Synthetic Co. and the like.

The blending ratio (weight ratio) of the urethane poly (meth)acrylate and TAIC is usually 1:9 to 9:1 and preferably 1:1 to 1:4.

(Other Crosslinking Aid)

The crosslinking aid according to the present invention may contain a polyfunctional (meth)acrylate unless the effects of the present invention are adversely affected by addition thereof. The polyfunctional (meth)acrylate is a compound having two or more (meth)acryloyl groups, and preferably three (meth)acryloyl groups, in a molecule thereof. Specific examples of the polyfunctional (meth) acrylate include trimethylolpropane tri(meth)acrylate, dimethylol propane tetra(meth)acrylate, pentaerythritol tri (meth)acrylate, pentaerythritol tetra(meth)acrylate, dipentaerythritol penta(meth)acrylate, dipentaerythritol hexa(meth)acrylate, and the like.

<Ethylene Copolymer>

The crosslinking aid according to the present invention may be used in either radiation-crosslinking or heat-crosslinking. That is, the resin composition obtained by blending the crosslinking aid with a cross-linkable polymer can be used either as a radiation-crosslinking resin composition or as a heat-crosslinking resin composition.

As the cross-linkable polymer, an ethylene copolymer is particularly preferred. The ethylene copolymer is a copolymer of ethylene as a main component and a monomer copolymerizable with the ethylene. Examples of the monomer include vinyl esters, unsaturated carboxylic acid esters, unsaturated carboxylic acids and metal salts thereof, unsaturated silicon compounds, α-olefins and the like. As the copolymerizable monomers, polar monomers are preferred. Specific examples of the ethylene copolymer include ethylene-vinyl ester copolymers such as ethylene-vinyl acetate copolymers, ethylene-unsaturated carboxylic acid ester copolymers such as ethylene-methyl acrylate copolymers and ethylene-isobutyl acrylate-methacrylic acid copolymers, and ionomers thereof. Of these ethylene copolymers, particularly preferred are the ethylene-vinyl acetate copolymers.

The amount of the crosslinking aid of the invention compounded in the radiation-crosslinking resin composition or the heat-crosslinking resin composition (as a total amount of the urethane poly(meth)acrylate and TAIC) is usually 0.1 to 3.0 parts by weight, and preferably 0.5 to 2.0 parts by weight based on 100 parts by weight of the ethylene copolymer. In addition, when using the polyfunctional (meth) acrylate as the other crosslinking aid in combination with the above crosslinking aid, the amount of the polyfunctional (meth)acrylate compounded is usually 0.1 to 3.0 parts by weight, and preferably 0.5 to 2.0 parts by weight based on 100 parts by weight of the ethylene copolymer.

<Crosslinking Agent>

In the heat-crosslinking, a crosslinking agent is used together with the crosslinking aid. As the crosslinking agent, an organic peroxide may be generally used. The organic peroxide is not particularly limited as long as it is a known organic peroxide to generate peroxy radicals under the vulcanization conditions. Examples of the organic peroxide include di-t-butylperoxide, dicumylperoxide, 2,5-dimethyl-2,5-di(benzoylperoxy)hexane, 2,5-dimethyl-2,5-di(t-butylperoxy)hexane, t-butylperoxy-2-ethylhexyl-monocarbonate, 1,1-bis(t-butylperoxy)-3,5,5-trimethyl cyclohexane, 2,5-dimethylhexane-2,5-dihydroxyperoxide, t-butylcumylperoxide, α,α'-bis(t-butylperoxy)-p-diisopropyl benzene, 2,5-dimethyl-2,5-di(t-butylperoxy)hexyne-3, benzoylperoxide, t-butylperoxy benzene, and the like.

The amount of the crosslinking agent compounded may vary depending on the type of the ethylene copolymer, and is usually 0.6 to 5 parts by weight, and preferably 1 to 2 parts by weight based on 100 parts by weight of the ethylene copolymer. In such a case as to carry out crosslinking by irradiation, the organic peroxide is not necessarily required.

In the radiation-crosslinking resin composition or the heat-crosslinking resin composition, for example, optional additives such as reinforcing agents, fillers, plasticizers, processing aids, lubricants, pigments, anti-aging agents, coupling agents, ultraviolet absorbers and acid acceptors can be used.

Specific examples of the anti-aging agents include di-t-butyl-P-cresol, pentaerythrityl-tetraxy[3-(3,5-di-t-butyl-4-hydroxyphenyl)propionate], 2,2'-methylenebis(2-methyl-6-t-butylphenyl), bis(2,2,6,6-tetramethyl-4-piperadyl) sebacate, N,N'-hexane-1,6-diylbis[3-(3,5-di-tert-butyl-4-hydroxyphenyl)propionamide], bis(2,2,6,6-tetramethyl-4-piperadyl)sebacate, hydroquinone monomethyl ether, methylhydroquinone, and the like.

Specific examples of the coupling agents include γ-chloropropyl trimethoxysilane, vinyl triethoxysilane, vinyl-tris-(β-methoxyethoxy)silane, γ-methacryloxypropyl trimethoxysilane, β-(3,4-ethoxy-cyclohexyl)ethyl trimethoxysilane, γ-glycidoxypropyl trimethoxysilane, γ-mercaptopropyltrimethoxysilane, γ-aminopropyl trimethoxysilane, N-β-(aminoethyl)-γ-aminopropyl trimethoxysilane, and the like.

Specific examples of the ultraviolet absorbers include 2-hydroxy-4-n-octyloxy benzophenone, 2,2-hydroxy 6-4,4-dimethoxy benzophenone, 2-(2'-hydroxy-5-methylphenyl) benzotriazole, p-t-butylphenyl salicylate, and the like.

Specific examples of the acid acceptors include magnesium hydroxide, calcium hydroxide, magnesium oxide, zinc oxide, and the like.

The amount of the additives added is usually not more than 10 parts by weight, and preferably not more than 5 parts by weight based on 100 parts by weight of the ethylene copolymer.

<Crosslinking of Ethylene Copolymer Composition>

As the radiation used in the radiation-crosslinking, accelerated electron beams, X-rays, α rays, β rays, γ rays, and the like are available. The irradiation dose may vary depending on the cross-linkable elastomer to be used, and is usually 0.1 to 500 kGy. The heat-crosslinking is conducted by using a molding machine, for example, an injection molding machine, a compression molding machine and the like, and heating at a temperature of 150 to 200° C. for about 2 to 30 min to obtain a molded body. If necessary, thereafter, the secondary crosslinking may be conducted by heating at a temperature of 150 to 200° C. for 1 to 10 hr. As the crosslinking of the ethylene copolymer composition described above, particularly the crosslinking using an organic peroxide is preferred.

The above ethylene copolymer composition is useful for use in the applications such as various packaging materials for foods, pharmaceuticals, industrial chemicals, agricultural materials and the like, various adhesive films, sealing films for various electric materials such as solar cells, liquid crystal, light emitting diodes, organic EL and the like, as well as useful for use in fields of hemodialysis, plasma component separation, desalting of protein solutions, fractionation, condensation, condensation of fruit juice, wastewater treatment, and the like. In particular, the above ethylene copolymer composition is useful as a sealing material used for assembly of various electronic material modules. Incidentally, in the case of a sealing material to be used in a considerably thickened form such as a sealing material for the solar cell, the sealing material fails to be cured with ultraviolet rays and electron beams, and therefore, the heat-crosslinking resin composition is used.

EXAMPLES

Next, the present invention is described in more detail below by the following Examples. However, these Examples are only illustrative and not intended to limit the present invention thereto.

Examples 1 to 3 and Comparative Examples 1 to 4

Respective components shown in Table 1 below were kneaded with an open roll mill. EVA (ethylene-vinyl acetate copolymer) containing 32% by weight of vinyl acetate was used. TAIC produced by NIPPON KASEI CHEMICAL COMPANY LIMITED was used as crosslinking aid 1, and respective compounds shown in Table 2 were used as crosslinking aid 2 in each Example or Comparative Example. The resulting composition was subjected to hot press crosslinking (primary crosslinking) at 150° C. to obtain a sheet having a thickness of 1 mm. A volume resistivity value of the sheet was measured by the method shown in Table 3. The measurement results are shown in Table 4.

TABLE 1

<Basic formulation>

| Components | Parts by weight |
|---|---|
| EVA | 100 |
| Organic peroxide | 1.3 |
| Crosslinking aid 1 (TAIC) | 0.5 |
| Crosslinking aid 2 | 0.5 |
| Silane coupling agent | 0.5 |
| Ultraviolet absorber | 0.2 |

TABLE 2

<Crosslinking aid 2>

| Symbol | Compound | Produced by |
|---|---|---|
| EB1290 | 6-functional urethane acrylate | Daicel-Cytec Co., Ltd. |
| KRM8452 | 10-functional urethane acrylate | Daicel-Cytec Co., Ltd. |
| U-15HA | 15-functional urethane acrylate | Shin-Nakamura Chemical Co., Ltd. |
| TMPTA | 3-functional acrylate (trimethylolpropane triacrylate) | |
| TMPTMA | 3-functional methacrylate (trimethylolpropane trimethacrylate) | |
| TAC | 3-functional arylate (triallyl cyanurate) | Evonik Industries AG |

TABLE 3

<Measuring device and measuring method>

| Super-insulating meter | SM-8220 (HIOKI E.E. Corp.) |
|---|---|
| Electrode for flat samples | SME-8310 (HIOKI E.E. Corp.) |
| Measuring method | A sample film was charged at applied voltage of 1000 V (AV.) for one min under environmental conditions of 20° C. and 30% RH. After that, power supply was stopped, and a volume resistivity value of the sample film was measured after 30 sec from the stop of power supply. A volume resistivity of the sample film was calculated from the thus measured value. |

TABLE 4

<Evaluation results>

| | Crosslinking aid 2 | Volume resistivity at 1000 V |
|---|---|---|
| Example 1 | EB-1290 | 7.48E+15 |
| Example 2 | KRM 8452 | 6.9E+15 |
| Example 3 | U-15HA | 5.33E+15 |
| Comparative Example 1 | TMPTA | 3.64E+15 |
| Comparative Example 2 | TMPTMA | 1.56E+15 |
| Comparative Example 3 | TAC | 2.4E+15 |
| Comparative Example 4 | TAIC | 2.35E+15 |

Examples 4 to 7

A urethane poly(meth)acrylate was synthesized using isophorone diisocyanate as an organic isocyanate and pentaerythritol triacrylate as a hydroxyl group-containing (meth)acrylate. The number-average molecular weight of the resulting urethane poly(meth)acrylate was measured by GPC. The measurement conditions are as follows.

<Number-Average Molecular Weight Measurement Conditions>

Apparatus name: HLC-8020GPC manufactured by Tosoh Corporation
Columns: TSKgel Super HM-N (2 columns)+HZ1000 (1 column)
Carrier: THF
Flow rate: 0.6 mL/min
Concentration: about 0.4%
Detector: RI
Column temperature: 40° C.
Calibration curve: Standard polystyrene An EVA sheet was produced using the above urethane poly(meth)acrylate as the crosslinking aid 2, and the volume resistivity of the EVA sheet was measured in the same manner as in Examples 1 to 3 and Comparative Examples 1 to 4.

The results were shown in Table 5.

TABLE 5

| | Number-average molecular weight of crosslinking aid 2 | Volume resistivity at 1000 V |
|---|---|---|
| Example 4 | 1477 | 2.23E+16 |
| Example 6 | 1201 | 9.56E+15 |
| Example 7 | 1134 | 7.01E+15 |
| Example 5 | 1053 | 4.30E+15 |

The invention claimed is:

1. A heat-crosslinking resin composition comprising an ethylene copolymer, a crosslinking agent and a crosslinking aid comprising a urethane poly(meth)acrylate in combination with triallyl isocyanurate.

2. A radiation-crosslinking resin composition comprising an ethylene copolymer and a crosslinking aid comprising a urethane poly(meth)acrylate in combination with triallyl isocyanurate.

3. A sealing material comprising the heat-crosslinking resin composition as defined in claim 1.

4. A sealing material comprising the radiation-crosslinking resin composition as defined in claim 2.

5. The sealing material according to claim 3, which is used for a solar cell.

6. An ethylene copolymer composition comprising an ethylene copolymer, urethane poly(meth)acrylate and triallyl isocyanurate.

7. A solar cell comprising the sealing material as defined in claim 5.

* * * * *